(12) United States Patent
Rahman et al.

(10) Patent No.: US 7,843,207 B2
(45) Date of Patent: Nov. 30, 2010

(54) METHODS AND APPARATUS TO TEST ELECTRONIC DEVICES

(75) Inventors: Abidur Rahman, Allen, TX (US); Chris Vogel, Wylie, TX (US)

(73) Assignee: Texas Instruments Incorporated, Dallas, TX (US)

( * ) Notice: Subject to any disclaimer, the term of this patent is extended or adjusted under 35 U.S.C. 154(b) by 148 days.

(21) Appl. No.: 12/345,419

(22) Filed: Dec. 29, 2008

(65) Prior Publication Data

US 2010/0164528 A1    Jul. 1, 2010

(51) Int. Cl.
*G01R 31/26* (2006.01)
(52) U.S. Cl. .................... 324/765; 324/769
(58) Field of Classification Search ............... None
See application file for complete search history.

(56) References Cited

U.S. PATENT DOCUMENTS 7,446,549 B2 * 11/2008 Tomita et al. ............... 324/763

* cited by examiner

*Primary Examiner*—Minh N Tang
(74) *Attorney, Agent, or Firm*—William B. Kempler; Wade J. Brady, III; Frederick J. Telecky, Jr.

(57) ABSTRACT

Methods and apparatus to test electronic devices are disclosed. An example method includes setting a first controlled switch to prevent a current detect signal from tripping an overcurrent protection event controlling an operation of the device; setting a second controlled switch to route a first sensed voltage associated with the device to a voltage adjuster; sending a calibration current corresponding to a target threshold current through the device; detecting the first sensed voltage while the calibration current flows through the device; and setting a reference signal substantially equal to the first sensed voltage, wherein the reference signal is to be used to generate the current detect signal.

20 Claims, 8 Drawing Sheets

METHODS AND APPARATUS TO TEST ELECTRONIC DEVICES

FIELD OF THE DISCLOSURE

This disclosure relates generally to integrated circuits and, more particularly, to methods and apparatus to test electronic devices.

BACKGROUND

Modern integrated circuits include millions of individual devices and/or circuits manufactured on a wafer (e.g., a substrate such as silicon, gallium arsenide, etc.). The individual devices and/or circuits of the wafer are tested at different stages of the manufacturing process to, for example, identify problems, calibrate devices, and/or validate proper functionality (e.g., to determine if a certain device or circuit will be packaged and/or further processed). Additionally or alternatively, the testing process often includes measurements of one or more performance characteristics associated with the devices or circuits as manufactured, such as a threshold current, a threshold voltage, a device impedance, a device on-resistance, etc.

SUMMARY OF THE INVENTION

Described herein are example methods, systems, apparatus, and/or articles of manufacture to test electronic devices. An example method to test a device includes setting a first controlled switch to prevent a current detect signal from tripping an overcurrent protection event controlling an operation of the device. Further, the example method includes setting a second controlled switch to route a first sensed voltage associated with the device to a voltage adjuster. Further, the example method includes sending a calibration current corresponding to a target threshold current through the device. Further, the example method includes detecting the first sensed voltage while the calibration current flows through the device. Further, the example method includes setting a reference signal substantially equal to the first sensed voltage, wherein the reference signal is to be used to generate the current detect signal.

An example apparatus to test a device includes a FET controller to receive a current detect signal from a comparator, the FET controller to turn off the FET when the current detect signal indicates an overcurrent condition. Further, the example apparatus includes a first controlled switch coupled to the comparator and the FET controller, the first controlled switch to prevent the current detect signal from reaching the FET controller. Further, the example apparatus includes a current source coupled to the FET to send a calibration current corresponding to a target threshold current through the FET. Further, the example apparatus includes a resistor coupled to a sense FET mirroring the FET, the resistor to detect a first voltage associated with the FET while the calibration current flows through the FET. Further, the example apparatus includes a voltage adjuster to set a reference voltage substantially equal to the first voltage, the comparator to receive the reference voltage to be used to generate the current detect signal.

An example method to test a field-effect transistor (FET) includes setting a first controlled switch to prevent a current detect signal from reaching a FET controller, the FET controller to turn off the FET when the current detect signal indicates an overcurrent condition. Further, the example method includes setting a second controlled switch to route a first voltage associated with the FET to a voltage adjuster. Further, the example method includes sending a calibration current corresponding to a target threshold current through the FET. Further, the example method includes measuring the first voltage while the calibration current flows through the FET. Further, the example method includes measuring a second voltage associated with the FET while the calibration current flows through the FET. Further, the example method includes removing the calibration current from the FET after the first and second voltages are measured. Further, the example method includes calculating an on-resistance of the FET using the second voltage. Further, the example method includes setting a reference voltage substantially equal to the first voltage, the reference voltage to be used to generate the current detect signal.

DETAILED DESCRIPTION

Figure 1:
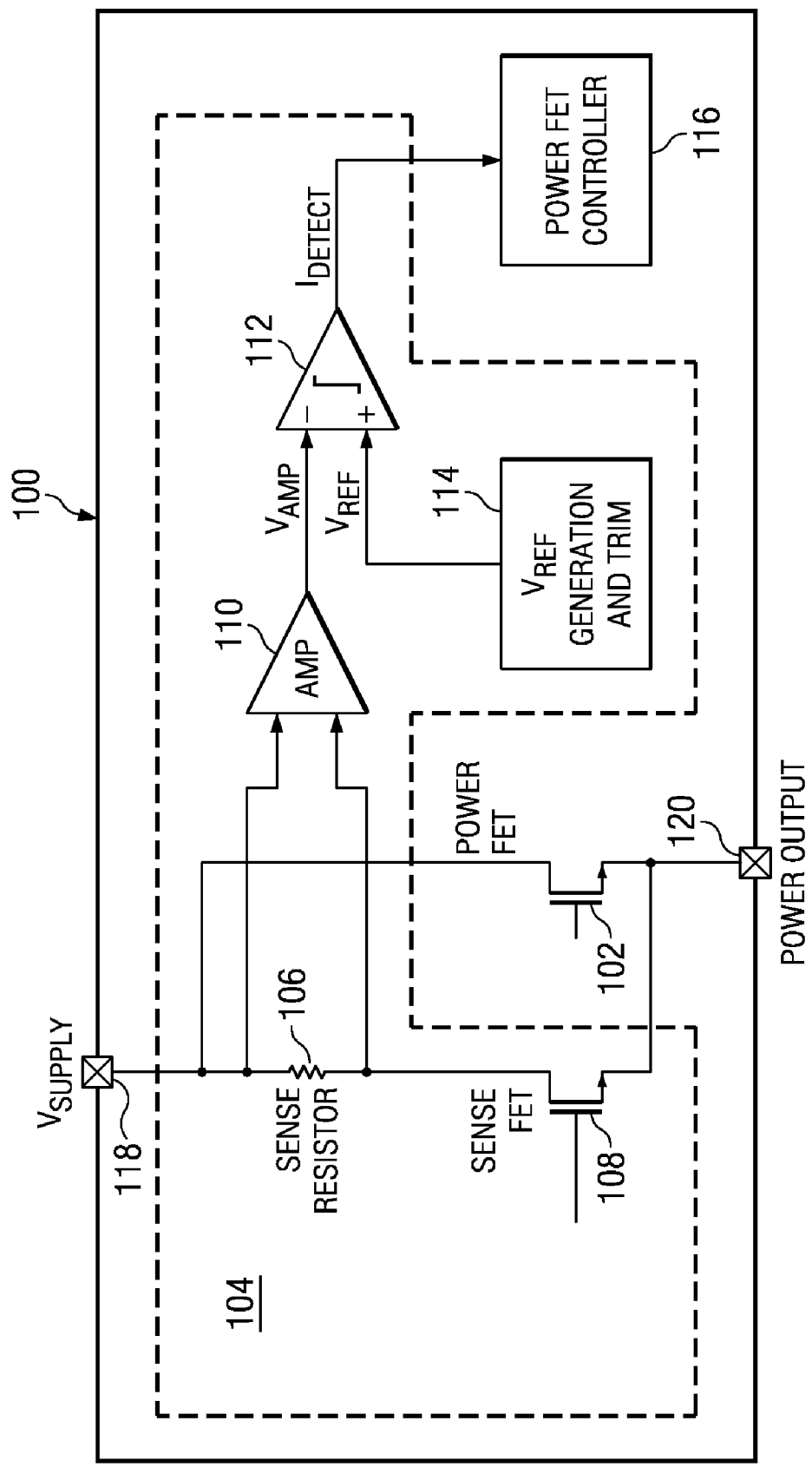
FIG. 1 is a block diagram of an example device to be tested using the example methods, apparatus, systems, and/or articles of manufacture described herein.

Although the following discloses example systems including, among other components, hardware and software executed on hardware, it should be noted that such systems are merely illustrative and should not be considered as limiting. For example, it is contemplated that any or all of these hardware and software components could be embodied exclusively in dedicated hardware, exclusively in software, exclusively in firmware or in some combination of hardware, firmware and/or software. Accordingly, while the following describes example systems, persons of ordinary skill in the art will readily appreciate that the examples are not the only way to implement such systems.

The costs in terms of time, man power, and/or equipment associated with integrated circuit testing have always been significant factors in the overall cost of production. However, technological advances that have improved the performance and usability of integrated circuits have also complicated the testing methods needed to ensure proper operation. For example, the consistent increase in the number of component devices that can be manufactured on a single wafer, the complexity of improved device arrangements, and the range of functionalities provided by the devices all increase the costs associated with testing. Therefore, in some integrated circuit manufacturing processes, the costs associated with testing procedures have expanded to become a more significant portion of overall production costs.

Integrated circuit testing typically involves measuring, analyzing, and/or verifying one or more parameters and/or performance characteristics associated with the devices or circuits thereof. In some instances, measured performance characteristics deviate from the expected or target performance characteristics that a particular device or circuit is designed to possess. In response to detecting such deviations, manufacturers can adjust (e.g., calibrate, tune, and/or trim) one or more parameters and/or characteristics of the device(s) and/or circuit(s) so that the device(s) and/or circuit(s) behave or operate according to design specifications and/or expectations.

For example, a current detect signal ($I_{DETECT}$) and a corresponding $I_{DETECT}$ threshold are measured, analyzed, and/or adjusted (e.g., calibrated using trim bits) during some test procedures. As referred to herein, $I_{DETECT}$ is an internal signal used by a device (e.g., a power field-effect transistor (FET)) to trip an operation (e.g., conducting current between a source and a drain of a FET) of the device in response to detecting a hazardous and/or undesirable condition (e.g., an overcurrent or undercurrent). That is, when the device experiences a hazardous and/or undesirable condition, $I_{DETECT}$ trips a protection event to cause a deactivation (e.g., a switching to an off-state) of the device. As referred to herein, the $I_{DETECT}$ threshold is a level of current experienced by the device and/or a component thereof that causes $I_{DETECT}$ to restrict the flow of current through the device. In other words, the $I_{DETECT}$ threshold is a current level determined to be indicative of a hazardous and/or undesirable condition. Thus, when the $I_{DETECT}$ threshold is detected in a component of the device (e.g., a FET and/or a sense FET configured to mirror the current flowing through the FET), $I_{DETECT}$ instructs a control element (e.g., a controller coupled to a gate or drive of a FET) to restrict current from flowing through the device.

Another parameter that is analyzed during some tests is an on-resistance. Generally, the on-resistance of a device is the resistance experienced by the current flowing through the device when the device is in an on-state. In the context of FETs (e.g., a high-side or low-side metal oxide semiconductor field-effect transistor (MOSFET)), the on-resistance ($R_{DSON}$) refers to the voltage drop across a drain and a source divided by the current flowing through the device (in accordance with Ohm's law).

As described in detail below in connection with FIGS. 2-5, traditional methods of measuring, analyzing, and/or adjusting these parameters involve multiple standalone tests that are performed separately, thereby requiring significant amounts of time and resources. Moreover, traditional methods of measuring, analyzing, and/or adjusting these parameters involve a plurality of test iterations that force many stressful high current pulses through the device, sometimes leading to damage from unstable switching associated with the high current pulses. The large amount of high current pulses also creates a higher likelihood that proximate device(s) (e.g., neighboring circuit(s) on a multi-site test board) will be exposed to potentially harmful noise during testing. Moreover, traditional methods of measuring, analyzing, and/or adjusting these parameters involve an appreciable amount of external components implemented on test boards having limited real estate for such components. Moreover, as described in greater detail below, traditional methods using iterative current pulsing suffer from low measurement accuracy that is limited by step sizes associated with the iterations.

The example methods, apparatus, systems, and/or articles of manufacture disclosed herein and described in connection with FIGS. 6-8 enable tests that were typically performed separately (e.g., as standalone tests) to be merged into a single test method or procedure. In particular, the example methods, apparatus, systems, and/or articles of manufacture described in connection with FIGS. 6-8 implement a merged test to (1) measure an on-resistance of a device and (2) achieve an accurate $I_{DETECT}$ and $I_{DETECT}$ threshold associated with the device. In turn, the example methods, apparatus, systems, and/or articles of manufacture described in connection with FIGS. 6-8 significantly reduce an amount of current pulses (e.g., high current pulses designed to test the limits of the device) and, correspondingly, an amount of instances in which the device is turned on and off during the tests. As described in greater detail below, such an improvement reduces the likelihood of damage caused to the device and/or test instrument(s) by high current switching associated with toggling between an on-state and an off-state.

Moreover, the example methods, apparatus, systems, and/or articles of manufacture disclosed herein and described in connection with FIGS. 6-8 reduce an amount of external components needed to perform the tests described herein. Such external components consume valuable real estate on test boards. The additional real estate provided by the example methods, apparatus, systems, and/or articles of manufacture described in connection with FIGS. 6-8 can be used to increase the amount of sites that can be tested with the same test equipment. Other advantages of the example methods, apparatus, systems, and/or articles of manufacture described in connection with FIGS. 6-8 include, for example, reduced test time, reduced test equipment costs, reduced noise experienced by proximate devices under test, higher measurement accuracy, reduced exposure to heat and/or other types of stresses, and increased throughput. These and other advantages of the example methods, apparatus, systems, and/or articles of manufacture described in connection with FIGS. 6-8 are described in greater detail below.

The example methods, apparatus, systems, and/or articles of manufacture described herein are described below in conjunction with power FETs as the devices under test. However, the example methods, apparatus, systems, and/or articles of manufacture described herein can be utilized by and/or used in conjunction with any type(s) of electronic device(s).

FIG. 1 is a block diagram of a device 100 to be tested using the example methods, apparatus, systems, and/or articles of manufacture described herein. For purposes of brevity and clarity, the example device 100 of FIG. 1 includes a single power FET 102 to be tested, although the device 100 may include additional or alternative components to be tested. That is, the tests described herein may be repeated for other devices implemented in the example device 100 of FIG. 1 and/or other components associated therewith.

To protect the FET 102 against overcurrents and undercurrents, the device 100 includes an example current detect mechanism 104. The example current detect mechanism 104 of FIG. 1 includes a sense resistor 106, a sense FET 108, an operational amplifier 110, a comparator 112, and a reference generation and trim unit 114. The example current detect mechanism 104 generates $I_{DETECT}$ and conveys $I_{DETECT}$ to an example power FET controller 116. The example FET controller 116 of FIG. 1 controls (e.g., directly or indirectly) the operation of the FET 102 by providing a suitable signal to a gate or drive of the FET 102 to control a level of current conducted by the FET 102. The example FET controller 116 responds to $I_{DETECT}$ by, for example, tripping an overcurrent protection event (e.g., disabling the gate or drive of the FET 102) when $I_{DETECT}$ is a logical high. Preferably, $I_{DETECT}$ is tripped or activated (e.g., set to a logical high) when a target $I_{DETECT}$ threshold (e.g., a value set out in design specifications and determined to be an ideal or preferred level of current to trip a deactivation of the FET 102) is experienced by the FET 102. However, the actual $I_{DETECT}$ threshold of a fabricated device often deviates from the target $I_{DETECT}$ threshold due to variances created by fabrication processes. Accordingly, some testing procedures involve verifying and/or adjusting settings (e.g., trim bits) associated with $I_{DETECT}$ and the $I_{DETECT}$ threshold.

To generate $I_{DETECT}$, the comparator 112 compares a reference signal, such as a voltage ($V_{REF}$), generated by the reference generation and trim unit 114 with a measured voltage ($V_{AMP}$) generated by the amplifier 110 in conjunction with the sense resistor 106. The measured voltage $V_{AMP}$ correlates to the amount of current flowing across the FET 102 from a power supply 118 to a power output 120. In particular, the measured voltage $V_{AMP}$ results from a current-to-voltage conversion implemented by the sense resistor 106, the sense FET 108, and the amplifier 110. The terminals of the amplifier 110 are coupled to the opposing terminals of the sense resistor 106 to measure a voltage drop across the sense resistor 106, which has a known resistance. The sense FET 108 is configured to mirror the current flowing through the power FET 102. Using the voltage drop across the sense resistor 106 and the known resistance of the sense resistor 106, the amount of current flowing through the sense FET 108 and, thus, the power FET 102 can be expressed by and/or determined from the measured voltage $V_{AMP}$.

The reference voltage $V_{REF}$ is set and/or adjusted (e.g., using one or more trim bits) in the reference generation and trim unit 114 to implement the $I_{DETECT}$ threshold. Specifically, if the measured voltage $V_{AMP}$ meets or exceeds the reference voltage $V_{REF}$, the output of the comparator 112 ($I_{DETECT}$) will be set to a logical high, causing the FET controller 116 to turn the FET 102 off. While the device 100 is designed to have an $I_{DETECT}$ threshold of a target value, fabrication processes often introduce variations from design parameters that alter the actual value of the $I_{DETECT}$ threshold needed in that particular implementation. Thus, tests are performed to measure the required $I_{DETECT}$ threshold after fabrication and, if necessary, to adjust the associated trim bits accordingly to achieve the target $I_{DETECT}$ threshold or a value as close as possible to the target $I_{DETECT}$ threshold.

Figure 2:
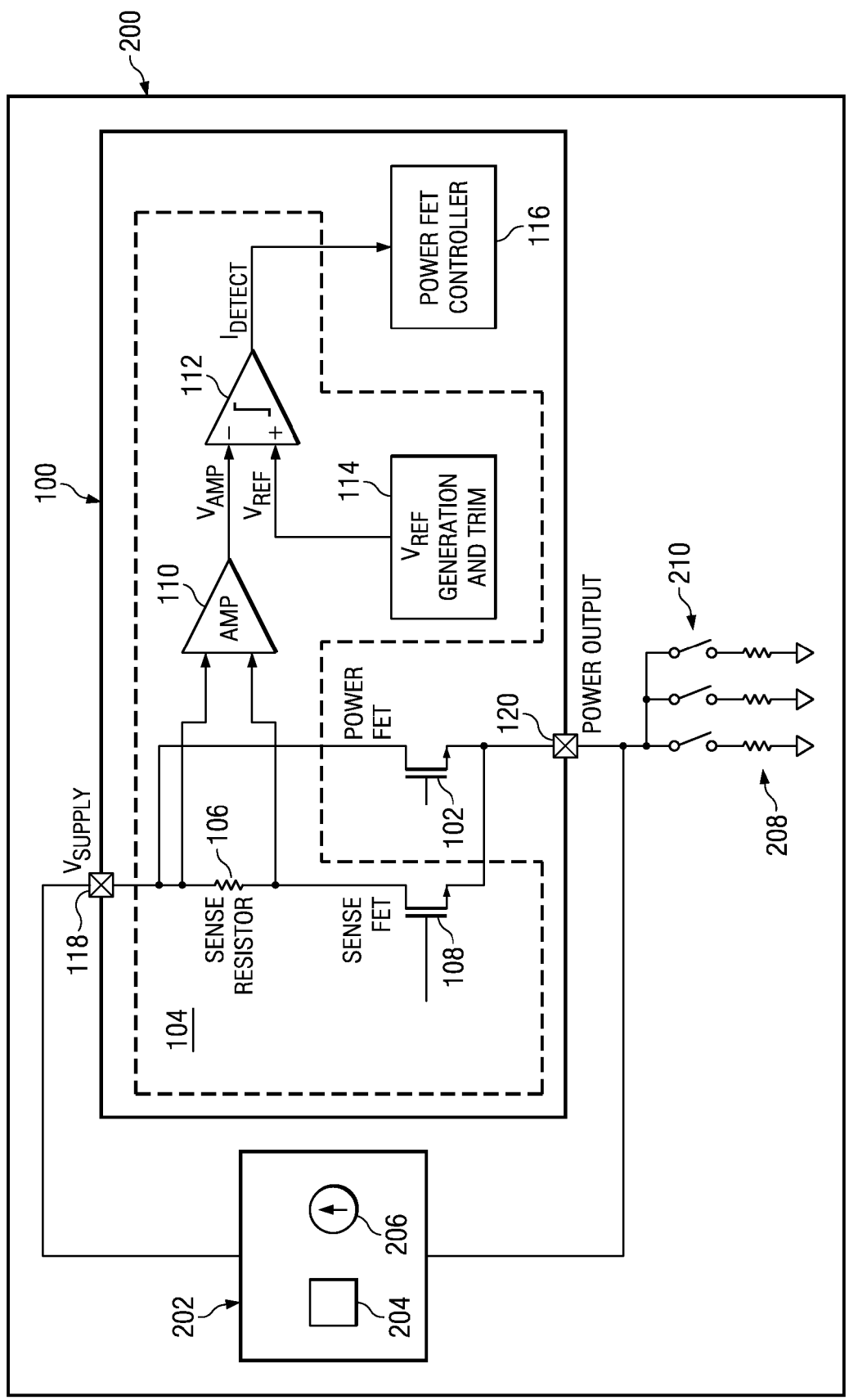
FIG. 2 is a block diagram of the example device of FIG. 1 configured to be tested using a first known test procedure.

FIG. 2 is a block diagram of the example device 100 of FIG. 1 configured to be tested using a first known test procedure encompassing these different tests. In the configuration of FIG. 2, the device 100 is coupled to a test board 200, which acts as an interface to implement the tests described herein. The test board 200 includes a tester instrument 202 having a current source 206 and an $R_{DSON}$ measurement unit 204 implemented therein. The test board 200 also includes an array of resistors 208 implemented externally of the device 100. The $R_{DSON}$ measurement unit 204 has the capability to take one or more measurements (e.g., a voltage drop using a voltmeter) and/or make one or more calculations using an internal or external computing device (e.g., the example processor system 910 of FIG. 9). As described below, each of the resistors 208 have a different resistance and may be selectively coupled to the power output 120 via a corresponding array of relays 210 to adjust the resistance at the power output 120.

Turning to the first known test procedure illustrated in FIG. 2, three standalone tests are performed to measure the $R_{DSON}$ of the device 100 and to verify and/or adjust the operation of the current detect mechanism 104. As described below, these known tests involve a large amount of high current pulses being forced through the FET 102. Further, this first known test procedure requires the external resistors 208 not only inhabit valuable real estate on the test board 200, but also require significant time and resources dedicated to the selective coupling of the resistors 208 to the power output 120 throughout the tests.

First, an iterative test is performed to set the trim bits of the generation and trim unit 114 such that the target $I_{DETECT}$ threshold is achieved or at least approached (e.g., set as close to the target $I_{DETECT}$ threshold as possible). Initially, the device 100 is turned off. The trim bits of the generation and trim unit 114 are set to a midpoint value. Then, at least one of the external resistors 208 is coupled to the power output 120. The external resistor(s) 208 to be coupled to the power output 120 are selected such that the power supply 118, which is set at a constant voltage, will cause a current substantially equal to the target $I_{DETECT}$ threshold to flow through the FET 102 when the device 100 is turned on.

The device 100 is then turned on, causing current to flow to the FET 102, and the device 100 is checked for an overcurrent condition (e.g., by determining if the current detect mechanism 104 resulted in a value of $I_{DETECT}$ sufficiently high to trip the power FET controller 116, thereby causing the power FET controller 116 to deactivate the FET 102). Depending on whether an overcurrent condition was detected, the trim bits are then incrementally adjusted to either increase or decrease the reference voltage $V_{REF}$. For example, if an overcurrent condition is detected, the trim bits are adjusted to incrementally decrease the reference voltage $V_{REF}$ and, thus, drive the $I_{DETECT}$ threshold to a lower current level. Otherwise, if an overcurrent condition is not detected, the trim bits are adjusted to incrementally increase the reference voltage $V_{REF}$ and, thus, drive the $I_{DETECT}$ threshold to a higher current level. The device 100 is then checked again for an overcurrent condition. The goal of this adjustment is to achieve a value for $V_{REF}$ that generates a current level of $I_{DETECT}$ as close to the target $I_{DETECT}$ threshold as possible. Thus, this first part of the test may be thought of as a calibration procedure to set the $V_{REF}$ generation and trim unit 114 to an appropriate level. Notably, the iterative process relies on the tripping of the overcurrent mechanism 104 to inform the test equipment that an overcurrent condition is present in the device 100.

The number of iterations performed depends on how many trim bits are implemented in the reference generation and trim unit 114. Precise trim bits (e.g., a five-bit binary trim number) may involve a large amount of iterations, each including a high current pulse that may place the FET 102 under a high current level. The repeated adjustment of the trim bits and checking for an overcurrent condition can be implemented using, for example, a binary search pattern.

With $V_{REF}$ calibrated, a second test is performed to measure the actual $I_{DETECT}$ threshold achieved via the binary search pattern described above. In particular, the $I_{DETECT}$ threshold that will drive $I_{DETECT}$ to a level to trip the power FET controller 116 (according to the corresponding value of the reference voltage $V_{REF}$ set in the test described above) is verified (e.g., determined to fall within one or more tolerances indicated as acceptable by, for example, a design engineer). To measure the actual $I_{DETECT}$ threshold, the device 100 is turned off and the power supply 118 is set to supply a minimal voltage to the FET 102. While the device 100 is off, one or more of the external resistors 208 are coupled to the power output 120. Unlike the test described above, the specific resistor(s) 208 coupled to the power output 108 will be changed during this $I_{DETECT}$ threshold measurement test.

Initially, the external resistor(s) 208 to be coupled to the power output 120 are selected such that a minimal current flows through the FET 102. The device 100 is then turned on and the device 100 is checked for an overcurrent condition (e.g., by determining whether the current detect mechanism 104 caused a deactivation of the FET 102). If an overcurrent condition is not detected, then the device 100 is turned off and the amount of voltage supplied by the power supply 118 is incrementally increased. The device 100 is again checked for an overcurrent condition. This process is repeated until an overcurrent condition is detected or a maximum voltage is reached by the incremental increases. If the maximum voltage value is reached without detecting an overcurrent condition, another one or more of the resistor(s) 208 are coupled to the power output 120. Specifically, the next resistor(s) 208 to be coupled to the power output 120 are selected such that the next lowest current (relative to the current experienced by the FET 102 during the previous iteration) flows through the FET 102. The power supply 118 is then reset to the minimal voltage to be applied to the FET 102. With the newly coupled resistor(s) 208 also drawing current, the device 100 is again checked for an overcurrent condition. If an overcurrent condition is not detected, the voltage supplied by the power supply 118 is incrementally increased as described above, until an overcurrent condition is detected or the maximum voltage is reached. This process of incrementally increasing the voltage at the power supply 118 and/or the current allowed to flow through the FET 102 by adjusting the resistor(s) 208 is repeated until an overcurrent condition is detected. When the overcurrent condition is detected, the actual $I_{DETECT}$ threshold can be determined based on the voltage supplied by the power supply 118 and the settings of the resistor(s) 204 at the time the overcurrent is detected. If the actual $I_{DETECT}$ threshold falls within predetermined tolerances (e.g., plus or minus a quarter of one amp), the device 100 can be recorded as having an acceptable current detect mechanism 104.

With the actual $I_{DETECT}$ threshold measured and appraised, a third test is performed to determine the $R_{DSON}$ for the device 100. As described above, the $R_{DSON}$ is the resistance across the drain and source of the FET 102 when the device 100 is on. To measure the $R_{DSON}$ in FIG. 1, a voltage is applied to the gate of the FET 102 to turn the FET 102 on. At the same time, the current source 206 of the tester instrument 202 provides a predetermined current to the drain of the FET 102. The $R_{DSON}$ measurement unit 204 measures the drain-source voltage (e.g., the voltage drop between the power supply 118 and the power output 120) of the FET 102. The $R_{DSON}$ measurement unit 204 then calculates the $R_{DSON}$ of the FET 102 by dividing the drain-source voltage by the current supplied by the current source 206. The measurement of $R_{DSON}$ is performed as a standalone process, requiring additional time to configure and run the measurement.

Figure 3:
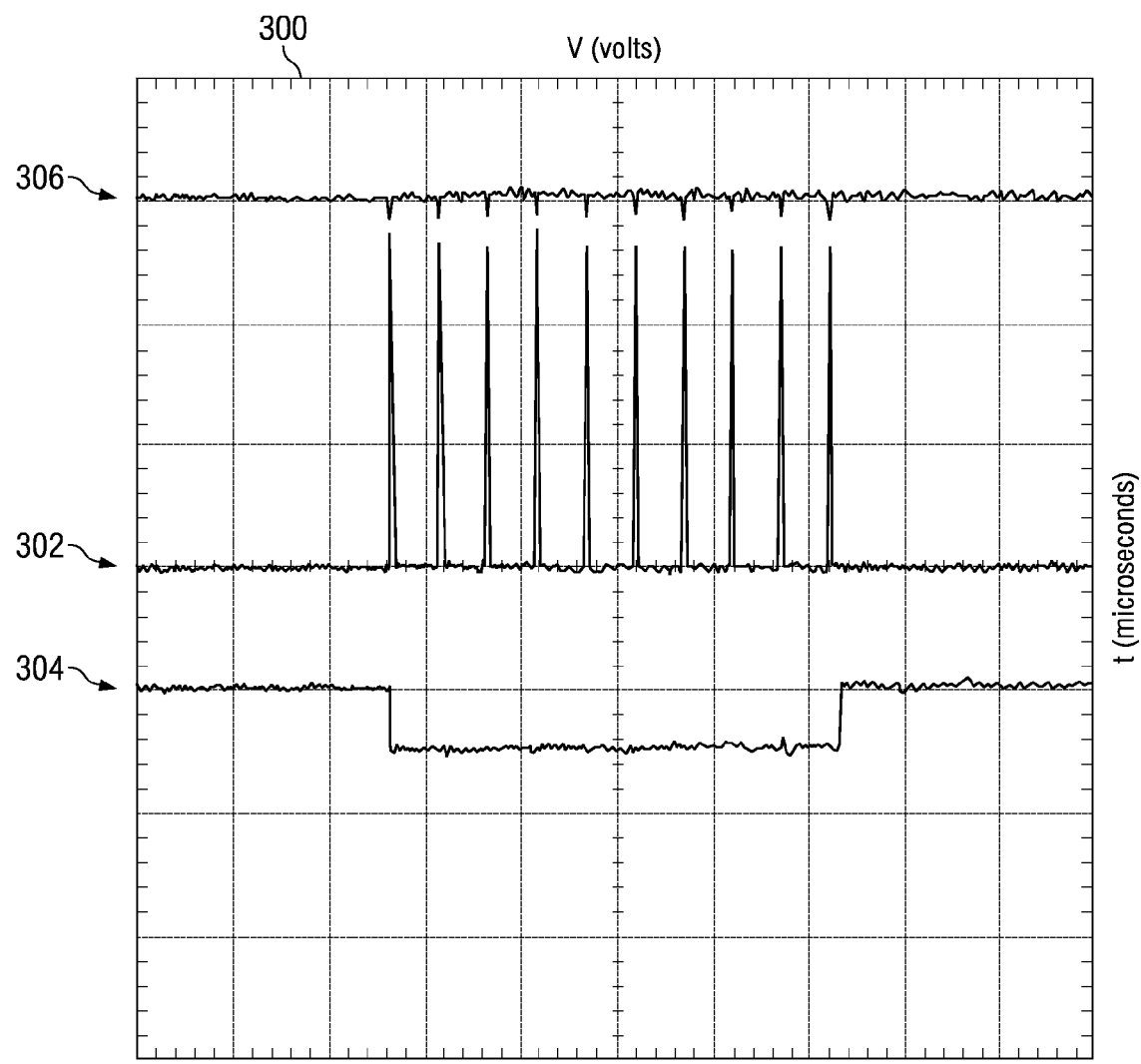
FIG. 3 is a graph showing readings taken during the first known test procedure described in connection with FIG. 2.

FIG. 3 is a graph 300 showing readings taken from the device 100 under the first known test procedure (e.g., the first, second, and third tests described above in connection with FIG. 2). In particular, the graph 300 shows readings taken from the device 100 during an iteration in which the FET 102 is checked for an overcurrent condition (e.g., when a plurality of high current pulses are sent through the FET 102 during the binary search pattern described above). A first signal 302 is associated with the source side of the FET 102 of FIG. 2 while under test. A second signal 304 is associated with a control pin of the power output 118. When the second signal 304 goes low, the first signal 302 is enabled. Thus, the voltage of the first signal 302 is relatively steady while the second signal 304 is high and the voltage of the first signal 302 significantly fluctuates while the second signal 304 is low. A third signal 306 is associated with the power supply 118 of FIG. 2 and remains substantially constant during the period of time represented by the graph 300 of FIG. 3 due to the constant voltage applied thereto.

As shown in the graph 300 of FIG. 3, the first signal 302 indicating the voltage of the source side of the FET 102, which is directly related to the current flowing through the FET 102 (e.g., according to the current-to-voltage conversion described above), rapidly switches between a high level (e.g., about twenty-seven volts) and a low level (e.g., zero volts). The rapid switching results from the high current pulses being forced through the FET 102 and the corresponding response of the current detect mechanism 104. In particular, when an overcurrent is detected (e.g., at a peak of the first signal 302), $I_{DETECT}$ trips the power FET controller 116 and the FET 102 is disabled, sending the first signal 302 to the low level (e.g., zero volts).

Each of these spikes in voltage (and current) stresses the FET 102 and/or other components of the device 100. The repeated high current pulses used during the binary search pattern cause a significant amount of power to be dissipated in the device 100, thereby causing an undesirable heating of the silicon and/or other materials used to fabricate the device 100. Due to the heat, the drain and source of the FET 102 may fuse together, thereby destroying the FET 102. Further, the resistors 208 and the relays 210 used to couple/decouple the resistors 208 to the power output 120 occupy valuable real estate on the test board 200. Further, the iterative processes described above are likely to impart potentially damaging noise on any proximate devices.

Figure 4:
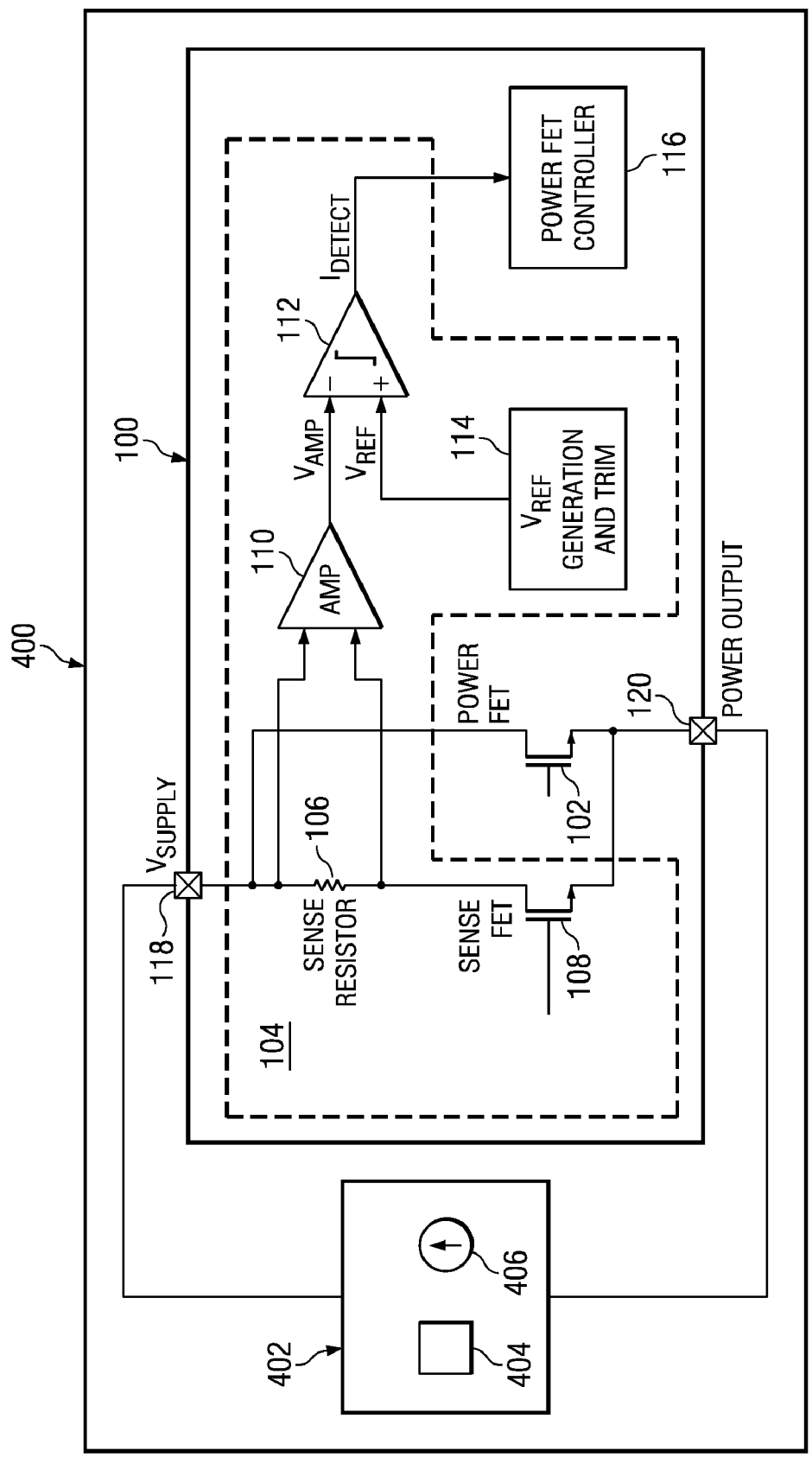
FIG. 4 is a block diagram of the example device of FIG. 1 configured to be tested using a second known test procedure.

FIG. 4 is a block diagram of a device 400 under a second known test procedure. Similar to the configuration described above in connection with FIG. 2, the device 100 of FIG. 4 is configured to be tested using a test board 400, which acts as an interface to implement the tests described below. In particular, the device 100 is coupled to a tester instrument 402 having a current source 406 and an RDSON measurement unit 404 implemented therein. Unlike the test board 200 described in connection with FIG. 2, the test board 400 of FIG. 4 does not include external resistors to be coupled to the power output 120 of the device 100. In other respects, the test boards 200, 400 are similar.

Turning to the second known test procedure illustrated in FIG. 4, standalone tests are performed to measure the $R_{DSON}$ of the device 100 and to verify and/or adjust the operation of the current detect mechanism 104. Similar to the tests of the first known test procedure described above in connection with FIG. 2, these tests involve a large amount of high current, potentially harmful, pulses being forced through the FET 102. Moreover, the large amount of iterations involved in these tests takes up time and resources during testing stages of the manufacturing process.

First, the tester instrument 402 is coupled to the device 100 and the trim bits of the reference generation and trim unit 114 are set to a midpoint value. The current source 406 then pulses the target $I_{DETECT}$ threshold through the FET 102. The device 100 is checked for an overcurrent condition (e.g., as detected by the current detect mechanism 104). To set the trim bits such that an $I_{DETECT}$ threshold as close to the target $I_{DETECT}$ threshold is achieved, the binary search pattern described above in connection with FIG. 2 is then performed. In particular, the trim bits of the reference generation and trim unit 114 are adjusted (e.g., incremented or decremented) and the FET 102 is again checked for an overcurrent condition until the closest $I_{DETECT}$ threshold to the target $I_{DETECT}$ threshold is set.

To measure the actual $I_{DETECT}$ threshold achieved in the trim bit adjustment procedure described above, the newly determined trim bits are fixed to generate the corresponding reference voltage $V_{REF}$. The current source 406 then pulses current (e.g., beginning with a relatively low current pulse) through the FET 102 and the device 100 is checked for an overcurrent condition at that current level. If the overcurrent condition is not detected (e.g., the power FET controller 116 does not disable the FET 102), the tester instrument 402 incrementally increases the level of current sent to the FET 102. When an overcurrent condition is detected, the measured $I_{DETECT}$ threshold is determined based on the last current pulse sent to the FET 102 by the current source 406. Thus, the reference voltage $V_{REF}$ has been set and the actual $I_{DETECT}$ threshold corresponding to the set reference voltage $V_{REF}$ is known to a tester and can be recorded.

Next, a test is performed to determine the $R_{DSON}$ for the device 100. Similar to the $R_{DSON}$ measurement described above in connection with FIG. 2, the current source 406 provides a predetermined current to the FET 102. The $R_{DSON}$ measurement unit 404 measures the drain-source voltage across the FET 102. The $R_{DSON}$ measurement unit 404 then calculates the $R_{DSON}$ of the FET 102 by dividing the drain-source voltage by the predetermined current. The $R_{DSON}$ measurement is performed as a standalone test, requiring time and resources dedicated to the corresponding separate test procedures.

Figure 5:
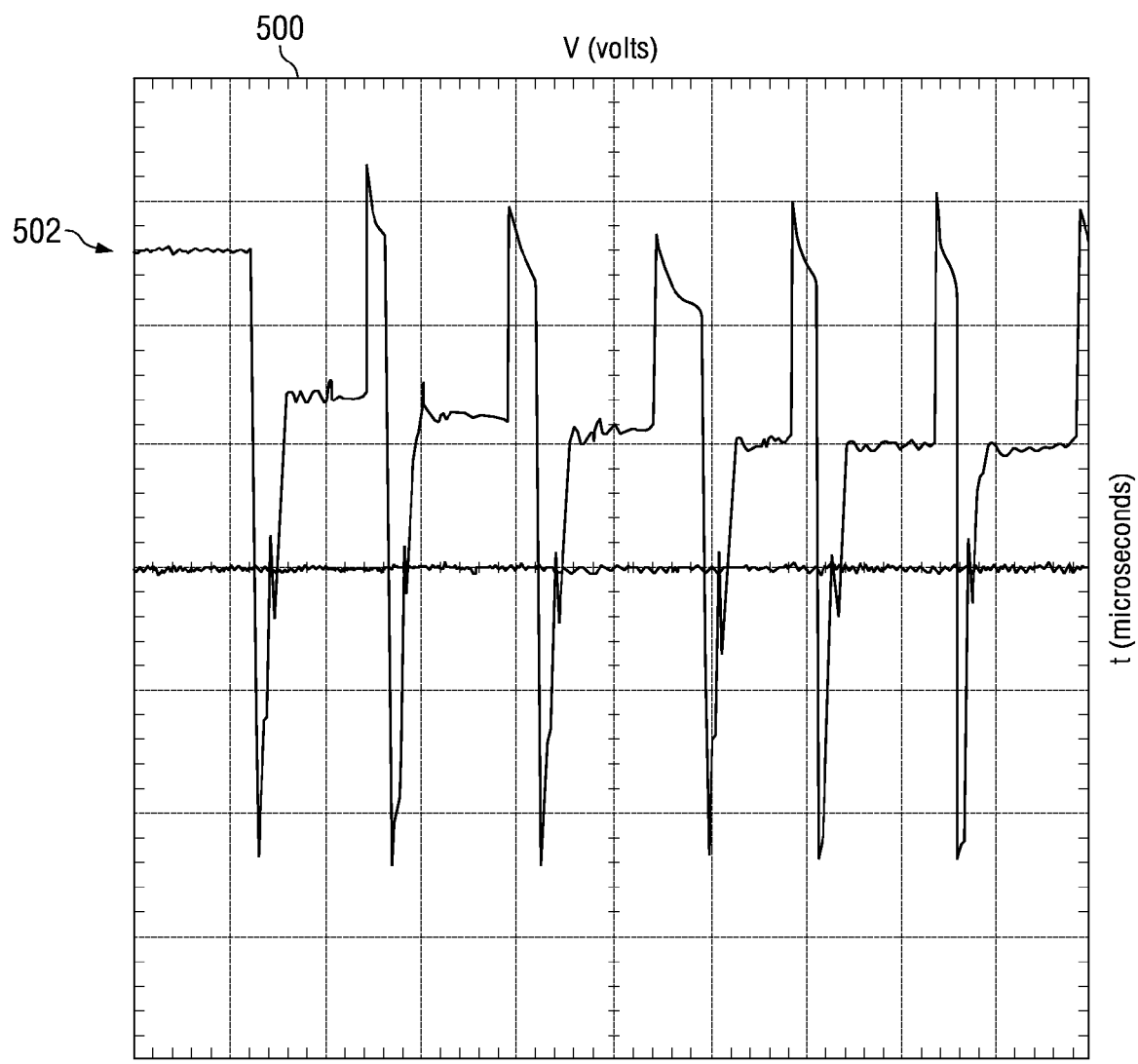
FIG. 5 is a graph showing readings taken during the second known test procedure described in connection with FIG. 4.

FIG. 5 is a graph 500 showing a reading taken from the device 100 under the tests described in connection with FIG. 4. In particular, the graph 500 shows a signal 502 that is associated with the source of the FET 102 while under the iterative tests described above in connection with FIG. 4. The graph 500 demonstrates how the FET 102 is repeatedly turned off (e.g., by the current detect mechanism 104) in response to the detection of an overcurrent condition caused by the high current pulses described above. In particular, the signal 502 is unstable due the inability of the tester instrument 402 to detect the turning off of the FET 102 fast enough. Specifically, the equipment used in the tester instrument 402 is typically too slow to stop sending current to the device 100 as soon as $I_{DETECT}$ is driven to a logical high. As a result, the voltage at the source of the FET 102 (as represented by the signal 502 in FIG. 5) exceeds the supply rails (e.g., twenty-three volts to zero volts) of the device 100. In the graph 500 of FIG. 5, the positive supply rail is the voltage (e.g., about twenty-three volts) indicated in approximately the first eleven microseconds and the negative supply rail is approximately ground. The portions of the signal 502 peaking above the positive supply rail of the device 100 correspond to periods of time in which the tester instrument 402 is supplying current despite $I_{DETECT}$ already being tripped (e.g., periods of time that the test instrument 402 should not be supplying current to the device 100 according to the current detect mechanism 104). Further, portions of the signal 502 exceed the negative supply rail of ground. Thus, the tester instrument 402 is typically too slow to prevent potentially damaging voltage and/or current levels beyond the supply rails.

In addition to the damaging struggle between the tester instrument 402 and the device 100, the tests described in connection with FIG. 4 experience the similar disadvantages and drawbacks as the tests described above in connection with FIG. 2.

Figure 6:
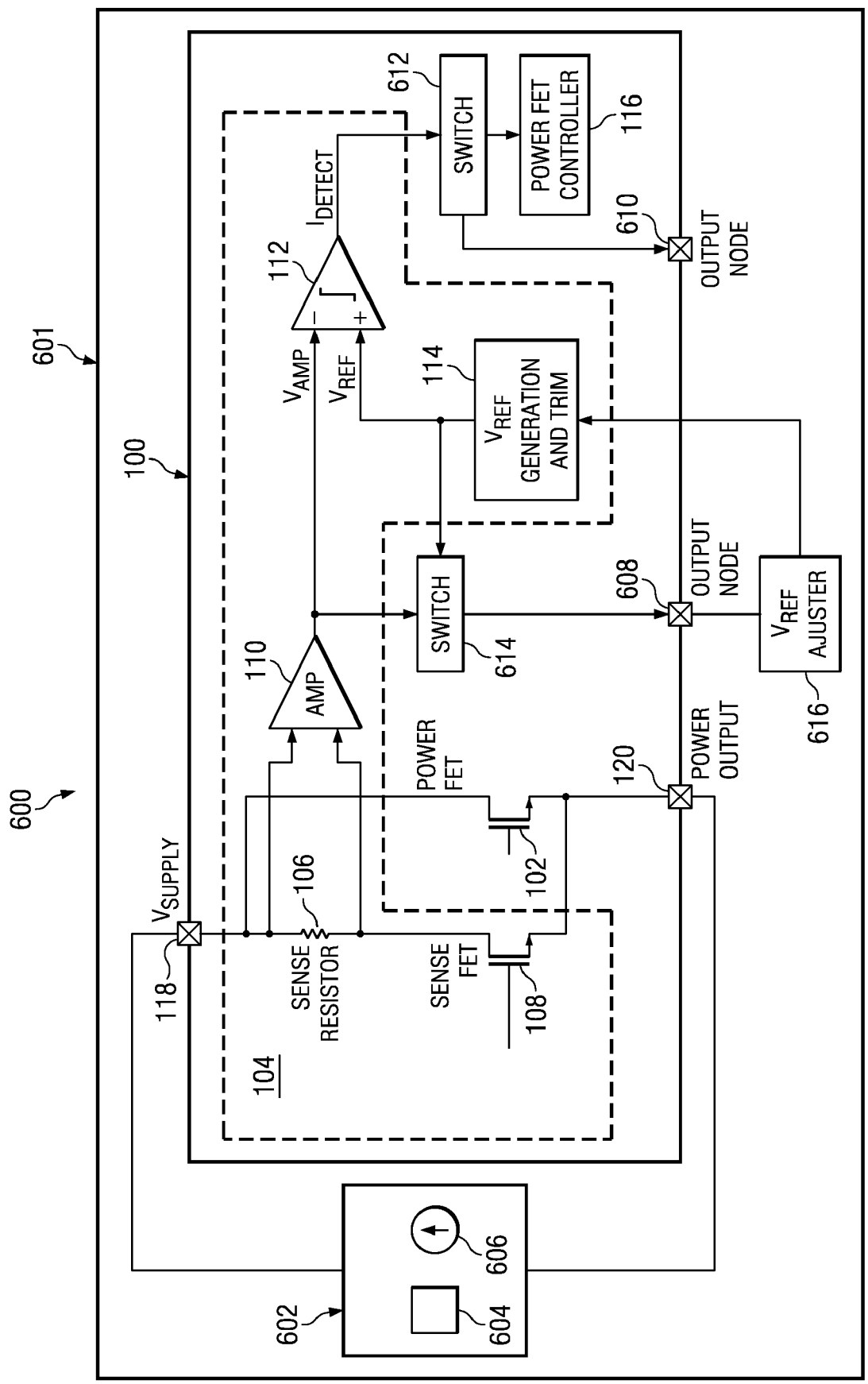
FIG. 6 is a block diagram of the example device of FIG. 1 configured to be tested using the example methods, systems, apparatus, and/or articles of manufacture disclosed herein.

FIG. 6 is a block diagram of an example test apparatus 600 configured to test the example device 100 of FIG. 1 using an example test that merges the standalone tests described above in connection with FIGS. 2-5 into a single procedure. The example test apparatus 600 of FIG. 6 includes a test board 601, a tester instrument 602 having an $R_{DSON}$ measurement unit 604 and a current source 606, a first output node 608, a second output node 610, a first controlled switch 612, a second controlled switch 614, a $V_{REF}$ adjuster 616, and a current detect mechanism 104. While an example manner of implementing the test apparatus 600 has been illustrated in FIG. 6, one or more of the elements, processes and/or devices illustrated in FIG. 6 may be combined, divided, re-arranged, omitted, eliminated and/or implemented in any other way. Further, the example tester instrument 602, the example $R_{DSON}$ measurement unit 604, the example current source 606, the example first output node 608, the example second output node 610, the example first controlled switch 612, the example second controlled switch 614, the example $V_{REF}$ adjuster 616, the example current detect mechanism 104, and/or, more generally, the example test apparatus 600 of FIG. 6 may be implemented by hardware, software, firmware and/or any combination of hardware, software and/or firmware. Thus, for example, any of the example tester instrument 602, the example $R_{DSON}$ measurement unit 604, the example current source 606, the example first output node 608, the example second output node 610, the example first controlled switch 612, the example second controlled switch 614, the example $V_{REF}$ adjuster 616, the example current detect mechanism 104, and/or, more generally, the example test apparatus 600 of FIG. 6 could be implemented by one or more circuit(s), programmable processor(s), application specific integrated circuit(s) (ASIC(s)), programmable logic device(s) (PLD(s)) and/or field programmable logic device(s) (FPLD(s)), etc. Further still, the example test apparatus 600 may include one or more elements, processes and/or devices in addition to, or instead of, those illustrated in FIG. 6, and/or may include more than one of any or all of the illustrated elements, processes and devices.

Generally, the example test apparatus 600 of FIG. 6 enables a measurement of the on-resistance $R_{DSON}$ and a calibration of the current detect mechanism 104 (e.g., by measuring and/or adjusting the $I_{DETECT}$ threshold and/or settings associated therewith, such as the reference voltage $V_{REF}$) using a single current pulse. The example tester instrument 602 is coupled to the power supply 118 and the power output 120 of the device 100. While the example tester instrument 602 is shown as including the example current source 606 and the example $R_{DSON}$ measurement unit 604, the example tester instrument 602 may include additional or alternative test equipment not shown in FIG. 6 for purposes of brevity clarity. Further, the current source 606 and the example $R_{DSON}$ measurement unit 604 of the example tester instrument 602 of FIG. 6 may be implemented in alternative locations of the example test board 600. Further, although shown separately from the tester instrument 602 in FIG. 6, the example $V_{REF}$ adjuster 616 may be implemented as part of the tester instrument 602. The example $R_{DSON}$ measurement unit 604 has the capability to take one or more measurements (e.g., a voltage drop using a voltmeter) and/or make one or more calculations using an internal or external computing device (e.g., the example processor system 910 of FIG. 9).

The example second controlled switch 614 receives the output ($V_{AMP}$) of the amplifier 110 and the reference voltage $V_{REF}$. As described in greater detail below, the second controlled switch 614 selectively makes one of these internal signals available to the first output node 608 and, thus, the $V_{REF}$ adjuster 616. The example first controlled switch 612 receives the signal $I_{DETECT}$ from the comparator 112. As described in greater detail below, the first controlled switch 612 selectively routes $I_{DETECT}$ to either the second output node 610 or the power FET controller 116. That is, the first controlled switch 612 restricts the power FET controller 116 from receiving $I_{DETECT}$ at certain times, thereby preventing the power FET controller 116 from disabling the FET 102 even when $I_{DETECT}$ is driven to a logical high. While the example test apparatus 600 of FIG. 6 includes the first controlled switch 612 and the second controlled switch 614 to provide the routing capabilities described herein, additional or alternative devices may be used to selectively route the internal signals ($V_{AMP}$, $V_{REF}$, and $I_{DETECT}$) of the device 100 to the first and second output nodes 608 and 610.

To measure $R_{DSON}$ and to calibrate the current detect mechanism 104 of the device 100 using a single current pulse, the tester instrument 602 is coupled to the device 100 as shown in FIG. 6. Further, the first controlled switch 612 is set to route $I_{DETECT}$ to the second output node 610. In other examples, $I_{DETECT}$ may be restricted from reaching the power FET controller 116 in alternative manner(s), such as by blocking $I_{DETECT}$ from being conveyed to the power FET controller 116 or by disabling an input of the power FET controller 116 configured to otherwise receive $I_{DETECT}$ from the comparator 112. In the illustrated example, the second controlled switch 614 is initially set to route $V_{AMP}$ to the first output node 610 and, thus, the VREF adjuster 616.

When the first controlled switch 612 and the second controlled switch 614 have been set as described above, the current source 606 sends a single current pulse at the target $I_{DETECT}$ threshold level to the FET 102. Because the first controlled switch 612 is set to route $I_{DETECT}$ away from the power FET controller 116, the current detect mechanism 104 does not cause the FET 102 to be disabled (e.g., in contrast to what occurs in response to the high current pulses described above in connection with FIGS. 2-5). Therefore, $R_{DSON}$ can be measured during this current pulse. In particular, the example $R_{DSON}$ measurement unit 604 of the tester instrument 602 measures the voltage drop across the FET 102 (e.g., the drain-source voltage $V_{DS}$). The example $R_{DSON}$ measurement unit 604 uses the measured voltage drop $V_{DS}$ to calculate $R_{DSON}$ according to Ohm's law. In particular, the $R_{DSON}$ measurement unit 604 divides the voltage drop $V_{DS}$ by the target $I_{DETECT}$ threshold current that was pulsed through the FET 102 during the measurement of $V_{DS}$. The quotient of this calculation is determined to be the $R_{DSON}$ of the FET 102.

Notably, the $R_{DSON}$ measurement is not performed as a standalone test. Thus, the same current pulse (e.g., the current pulse of the target $I_{DETECT}$ threshold) that is used by the $V_{REF}$ adjuster to calibrate the current detect mechanism 104, can be used to calculate $R_{DSON}$. As described above, the current detect mechanism 104 (e.g., via the sense resistor 106, the sense FET 108, and the amplifier 110) converts the amount of current flowing through the FET 102 to a corresponding voltage $V_{AMP}$. Thus, the measured voltage $V_{AMP}$ during the current pulse of the target $I_{DETECT}$ threshold corresponds to the voltage level that should trip $I_{DETECT}$. In the illustrated example, the second controlled switch 614 routes the value of $V_{AMP}$ corresponding to the current pulse of the target $I_{DETECT}$ current to the first output node 608 and, thus, the $V_{REF}$ adjuster 616.

After the example $V_{REF}$ adjuster 616 receives the measured voltage $V_{AMP}$, the device 100 is turned off such that substantially zero current flows through the FET 102. The second controlled switch 614 is then set to route the reference voltage $V_{REF}$ to the first output node 608 and, thus, the $V_{REF}$ adjuster 616. The example $V_{REF}$ adjuster 616 uses the value of the reference voltage $V_{REF}$ and the voltage $V_{AMP}$ measured during the current pulse of the target $I_{DETECT}$ threshold to calibrate the current detect mechanism 104. In particular, the example $V_{REF}$ adjuster 616 adjusts the value of the reference voltage $V_{REF}$ to substantially equal the measured voltage $V_{AMP}$. In the illustrated example, the example $V_{REF}$ adjuster 616 adjusts the trim bits of the reference generation and trim unit 114 such that the reference voltage $V_{REF}$ equals the voltage $V_{AMP}$ measured during the previous current pulse of the target $I_{DETECT}$ threshold. The trim bits can be set using any suitable method such as, for example, a binary search for the configuration of the bits that correspond to the desired voltage. Accordingly, during operation of the device 100, $I_{DETECT}$ will be driven to a logical high when a current of the target $I_{DETECT}$ threshold flows through the FET 102. In contrast to the tests described in connection with FIGS. 2-5, the accuracy of this calibration of the current detect mechanism 104 is not limited by any step size associated with an iterative process of incrementally testing the limits of the device 100. However, in some examples, the accuracy of the calibration may be limited by the step size of the internal $V_{REF}$ generation and trim unit 114.

The calibrated $I_{DETECT}$ threshold and/or any predetermined tolerances associated therewith can subsequently be verified by, for example, the current source 606 pulsing one or more currents through the FET 102 slightly above and/or below the target $I_{DETECT}$ threshold. If the current detect mechanism 104 was calibrated sufficiently, $I_{DETECT}$ will be driven to a logical high in response to the current pulse slightly above the target $I_{DETECT}$ threshold and $I_{DETECT}$ will not trip to a logical high in response to the current pulse slightly below the target $I_{DETECT}$ threshold. The tolerances may be values set in design specifications as acceptable variances.

Figure 7:
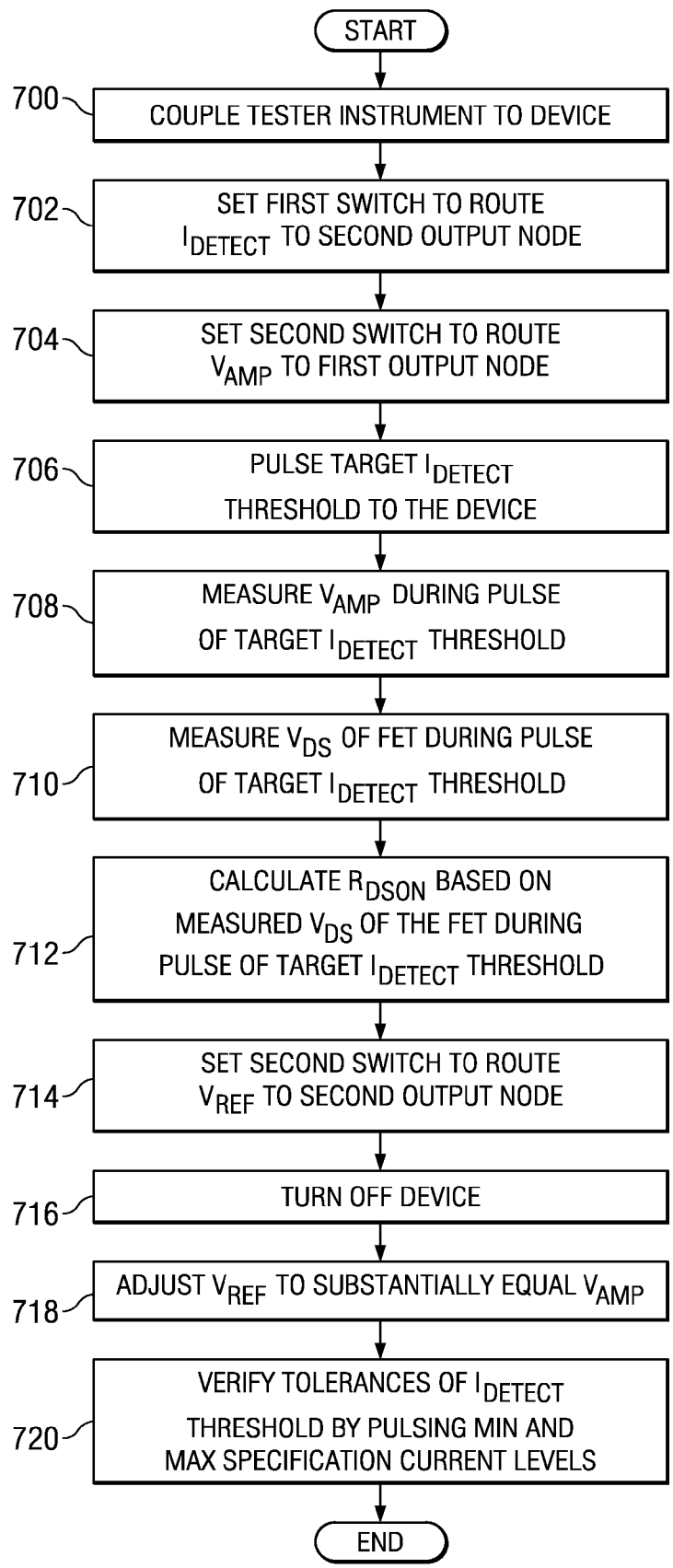
FIG. 7 is a flow diagram representative of example machine readable instructions that may be executed to implement the example test methods, systems, apparatus, and/or articles of manufacture described in connection with FIG. 6.

FIG. 7 is a flow diagram representative of example machine readable instructions that may be executed to implement the example test methods, systems, apparatus, and/or articles of manufacture described in connection with FIG. 6. The example processes of FIG. 7 may be performed using a processor, a controller and/or any other suitable processing device. For example, the example processes of FIG. 7 may be implemented in coded instructions stored on a tangible medium such as a flash memory, a read-only memory (ROM) and/or random-access memory (RAM) associated with a processor (e.g., the example processor 912 discussed below in connection with FIG. 9). Alternatively, some or all of the example processes of FIG. 7 may be implemented using any combination(s) of application specific integrated circuit(s) (ASIC(s)), programmable logic device(s) (PLD(s)), field programmable logic device(s) (FPLD(s)), discrete logic, hardware, firmware, etc. Also, some or all of the example processes of FIG. 7 may be implemented manually or as any combination(s) of any of the foregoing techniques, for example, any combination of firmware, software, discrete logic and/or hardware. Further, although the example processes of FIG. 7 are described with reference to the flow diagrams of FIG. 7, other methods of implementing the processes of FIG. 7 may be employed. For example, the order of execution of the blocks may be changed, and/or some of the blocks described may be changed, eliminated, sub-divided, or combined. Additionally, any or all of the example processes of FIG. 7 may be performed sequentially and/or in parallel by, for example, separate processing threads, processors, devices, discrete logic, circuits, etc.

To begin, the example tester instrument 602 of FIG. 6 is coupled to the device 100 (block 700). In particular, the test instrument 602 is coupled to the power supply 118 and the power output 120. The example first controlled switch 612 is set to route $I_{DETECT}$ to the second output node 610 (block 702). As described above, setting the first controlled switch 612 to route $I_{DETECT}$ away from the power FET controller 116 prevents the current detect mechanism 104 from disabling the FET 102. The example second controlled switch 614 is set to route the output of the amplifier 110 ($V_{AMP}$) to the first output node 608 (block 704).

The example current source 606 of the tester instrument 602 then forces a current substantially equal to the target $I_{DETECT}$ threshold through the device 100 (block 706). In response, a current flows through the FET 102. The sense FET 108 is configured to mirror the current flowing through the FET 102. A corresponding current flows through the sense resistor 106. A voltage drop across the sense resistor 106 is detected and conveyed to the amplifier 110. Thus, the voltage signals received by the amplifier 100 represent a value that correlates to the current flowing through the FET 102 (e.g., according to the current-to-voltage conversion described above).

The value of the resulting measured voltage $V_{AMP}$ (e.g., the voltage corresponding to the target $I_{DETECT}$ threshold current) is measured and/or received by the example $V_{REF}$ adjuster 616 of FIG. 6 via the first output node 608 (block 708). Further, the example $R_{DSON}$ measurement unit 604 of FIG. 6 measures the drain-source voltage $V_{DS}$ of the FET 102 during the pulse of the target $I_{DETECT}$ threshold current (block 710). The example $R_{DSON}$ measurement unit 604 then calculates the $R_{DSON}$ of the device 100 by dividing the drain-source voltage $V_{DS}$ associated with the FET 102 by the current pulsed through the device 100 by the current source 606 (e.g., according to Ohm's law) (block 712).

In the illustrated example, after the $V_{REF}$ adjuster 616 has received the measured voltage $V_{AMP}$ from the amplifier 110 (block 708), the second controlled switch 614 is set to route the reference voltage $V_{REF}$ to the $V_{REF}$ adjuster 616 (block 714). The device 100 and/or the tester instrument 602 is turned off so that the FET 102 does not receive current (block 716). The example $V_{REF}$ adjuster 616 then adjusts the reference voltage $V_{REF}$ to be substantially equal to the measured voltage $V_{AMP}$, which corresponds to the voltage drop (and current) experienced by the FET 102 during a pulse of the target $I_{DETECT}$ threshold current (block 718). For example, the $V_{REF}$ adjuster 616 adjusts the trim bits of the reference generation and trim unit 114 so that the reference voltage $V_{REF}$ is substantially equal to the measured voltage $V_{AMP}$ associated with the target $I_{DETECT}$ threshold current.

In the illustrated example, the first controlled switch 612 remains set to route $I_{DETECT}$ to the first output node 610. The functionality 116 of the current detect mechanism 104 is verified using two more current pulses (block 720). Specifically, the tester instrument 602 forces a first verification current slightly below the target $I_{DETECT}$ threshold through the device 100. If the first output node 610 indicates that an $I_{DETECT}$ event has not occurred in response to the first verification current (e.g., the first output node 610 does not transition to a logical high), the verification process can continue. The tester instrument 602 also forces a second verification current slightly above the target $I_{DETECT}$ threshold through the device 100. If the first output node 610 indicates that an $I_{DETECT}$ event has occurred in response to the second verification current (e.g., the first output node 610 transitions to a logical high), the calibration of the current detect mechanism 104 described above is verified. On the other hand, if the first verification current causes the first output node 610 to indicate that that an $I_{DETECT}$ event has occurred or if the second verification current causes the first output node 610 to indicated that an $I_{DETECT}$ event has not occurred), the calibration of the current detect mechanism 104 described above is unverified and the device 100 should be rejected as not correctly responding to an $I_{DETECT}$ event and/or further testing may be necessary.

Figure 8:
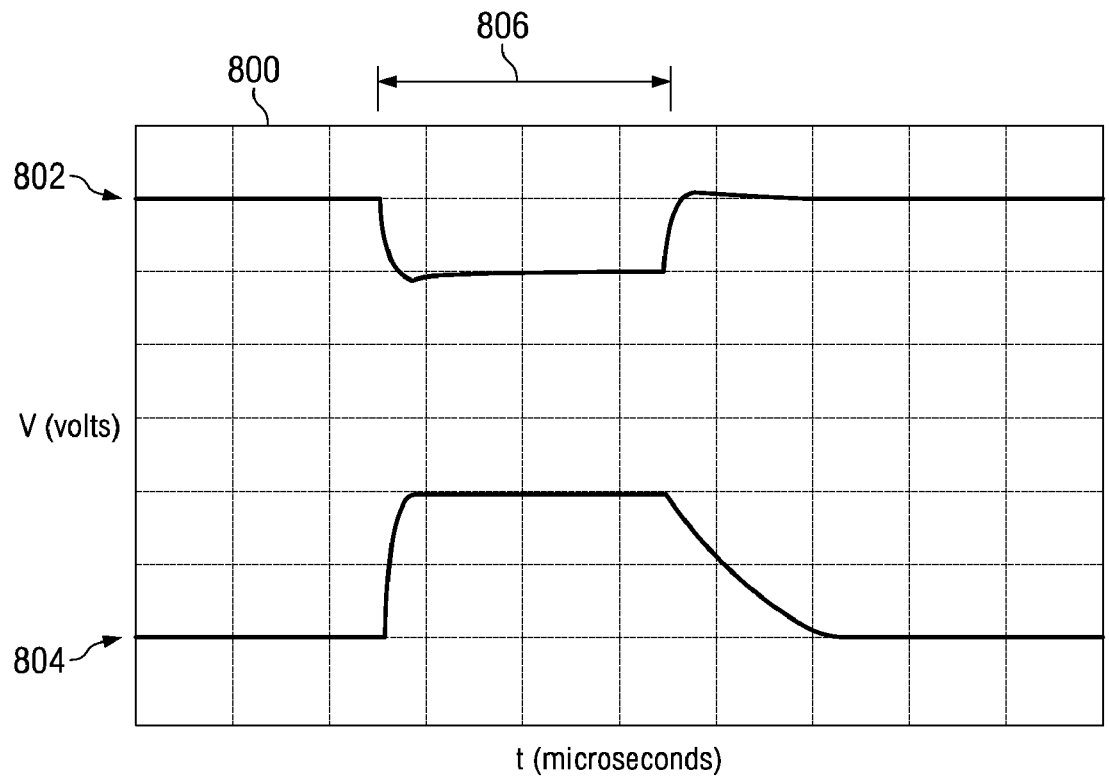
FIG. 8 is a graph showing readings taken from the example device of FIG. 6 under the example test methods, systems, apparatus, and/or articles of manufacture described in connection with FIGS. 6 and/or 7.

FIG. 8 is a graph 800 showing readings taken from the example device 100 of FIG. 6 under the example test methods, systems, apparatus, and/or articles of manufacture described in connection with FIGS. 6 and/or 7. The graph 800 includes a first signal 802 associated with the source of the FET 100 of FIG. 6 and a second signal 804 associated with the measured voltage $V_{AMP}$, which is made available by the second controlled switch 614 at the first output node 608. The time period indicated by reference numeral 806 corresponds to the current pulse of the target $I_{DETECT}$ threshold sent through the device 100 by the current source 606 at block 706 of FIG. 7.

The first signal 802 shows that the source of the FET 102 experiences a steady voltage throughout the current pulse due to the first controlled switch 612 preventing $I_{DETECT}$ from reaching the power FET controller 116. As described above, this enables the $R_{DSON}$ measurement unit 604 to perform the $R_{DSON}$ measurement using the same current pulse used to calibrate the current detect mechanism 104. As a result, the example test apparatus 600 of FIG. 6 eliminates the additional time, resources, costs, etc. needed to perform the $R_{DSON}$ measurement as a standalone test.

Moreover, the steady voltage indicated by the first signal 802 shows that the device 100 does not undergo the many iterative high current pulses associated with the prior known iterative processes described in connection with FIGS. 2-5. In fact, the prior known iterative tests described in connection with FIG. 2-5 can potentially involve hundreds or more high current pulses. In contrast, the example test apparatus 600 of FIG. 6 and the example machine readable instructions of FIG. 7 enable the $R_{DSON}$ measurement and the current detect mechanism calibration to be accomplished using a single current pulse. In some examples, the example test apparatus 600 also implements a verification process involving two additional current pulses for a total of three high current pulses to the device. Such a reduction in high current pulses reduces stress on the device 100, reduces test time, reduces device heating, etc.

Figure 9:
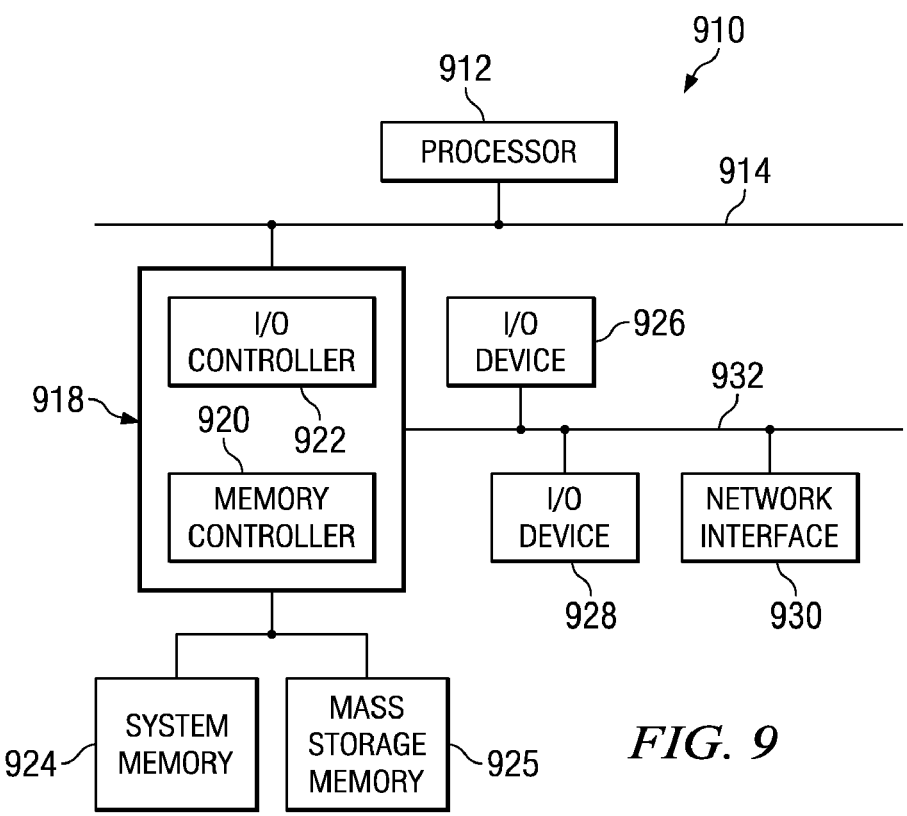
FIG. 9 is a block diagram of an example processor system that may be used to execute the machine readable instructions of FIG. 7 to implement the example tests described in connection with FIG. 6.

FIG. 9 is a block diagram of an example processor system 910 that may be used to execute the machine-readable instructions of FIG. 7 to implement the example tests described in connection with FIG. 6. As shown in FIG. 9, the processor system 910 includes a processor 912 that is coupled to an interconnection bus 914. The processor 912 may be any suitable processor, processing unit or microprocessor. Although not shown in FIG. 9, the system 910 may be a multi-processor system and, thus, may include one or more additional processors that are different, identical or similar to the processor 912 and that are communicatively coupled to the interconnection bus 914.

The processor 912 of FIG. 9 is coupled to a chipset 918, which includes a memory controller 920 and an input/output (I/O) controller 922. The chipset 918 provides I/O and memory management functions as well as a plurality of general purpose and/or special purpose registers, timers, etc. that are accessible or used by one or more processors coupled to the chipset 918. The memory controller 920 performs functions that enable the processor 912 (or processors if there are multiple processors) to access a system memory 924 and a mass storage memory 925.

The system memory 924 may include any desired type of volatile and/or non-volatile memory such as, for example, static random access memory (SRAM), dynamic random access memory (DRAM), flash memory, read-only memory (ROM), etc. The mass storage memory 925 may include any desired type of mass storage device including hard disk drives, optical drives, tape storage devices, etc.

The I/O controller 922 performs functions that enable the processor 912 to communicate with peripheral input/output (I/O) devices 926 and 928 and a network interface 930 via an I/O bus 932. The I/O devices 926 and 928 may be any desired type of I/O device such as, for example, a keyboard, a video display or monitor, a mouse, etc. The network interface 930 may be, for example, an Ethernet device, an asynchronous transfer mode (ATM) device, an 802.11 device, a DSL modem, a cable modem, a cellular modem, etc. that enables the processor system 910 to communicate with another processor system.

While the memory controller 920 and the I/O controller 922 are depicted in FIG. 9 as separate blocks within the chipset 918, the functions performed by these blocks may be integrated within a single semiconductor circuit or may be implemented using two or more separate integrated circuits.

Although certain example methods, apparatus and articles of manufacture are described herein, other implementations are possible. The scope of coverage of this patent is not limited to the specific examples described herein. On the contrary, this patent covers all apparatus, methods, and articles of manufacture falling within the scope of the invention.

What is claimed is:

1. A method of testing a device, comprising:
   setting a first controlled switch to prevent a current detect signal from tripping an overcurrent protection event controlling an operation of the device;
   setting a second controlled switch to route a first sensed voltage associated with the device to a voltage adjuster;
   sending a calibration current corresponding to a target threshold current through the device;
   detecting the first sensed voltage while the calibration current flows through the device; and
   setting a reference signal substantially equal to the first sensed voltage, wherein the reference signal is to be used to generate the current detect signal.

2. A method as defined in claim 1, further comprising detecting a second sensed voltage associated with the device while the calibration current flows through the device.

3. A method as defined in claim 2, further comprising using the second sensed voltage to measure an on-resistance of the device.

4. A method as defined in claim 1, wherein setting the reference signal comprises adjusting one or more trim bits associated with the reference signal.

5. A method as defined in claim 1, wherein the first sensed voltage and the reference signal are to be compared to generate the current detect signal.

6. A method as defined in claim 1, further comprising removing the calibration current from the device before setting the reference signal substantially equal to the first sensed voltage.

7. A method as defined in claim 1, further comprising:
   sending a first verification current through the device;
   determining whether the current detect signal is activated in response to the first verification current;
   sending a second verification current less than the first verification current through the device; and
   determining whether the current detect signal is activated in response to the second verification current.

8. A method as defined in claim 7, wherein the first verification current is greater than the target threshold current, and wherein the second verification current is less than the target threshold current.

9. A method as defined in claim 7, further comprising rejecting the device as functioning incorrectly in response to determining that the current detect signal is not activated in response to the first verification current.

10. A method as defined in claim 7, further comprising rejecting the device as functioning incorrectly in response to determining that the current detect signal is activated in response to the second verification current.

11. A method as defined in claim 1, further comprising a controller to switch off the device in response to the current detect signal tripping the overcurrent protection event.

12. An apparatus to test a field-effect transistor (FET), comprising:
    a FET controller to receive a current detect signal from a comparator, the FET controller to turn off the FET when the current detect signal indicates an overcurrent condition;
    a first controlled switch coupled to the comparator and the FET controller, the first controlled switch to prevent the current detect signal from reaching the FET controller;
    a current source coupled to the FET to send a calibration current corresponding to a target threshold current through the FET;
    a resistor coupled to a sense FET mirroring the FET, the resistor to detect a first voltage associated with the FET while the calibration current flows through the FET; and
    a voltage adjuster to set a reference voltage substantially equal to the first voltage, the comparator to receive the reference voltage to be used to generate the current detect signal.

13. An apparatus as defined in claim 12, further comprising a second controlled switch to route the first voltage to the voltage adjuster to set the reference signal substantially equal to the first characteristic.

14. An apparatus as defined in claim 12, further comprising a measurement unit coupled to the FET to detect a second voltage associated with the FET while the calibration current flows through the FET.

15. An apparatus as defined in claim 14, wherein the second voltage is a drain-source voltage associated with the FET while the calibration current flows through the FET.

16. An apparatus as defined in claim 14, wherein the measurement unit uses the second voltage to measure an on-resistance of the FET.

17. An apparatus as defined in claim 12, wherein the voltage adjuster sets the reference signal substantially equal to the first voltage by adjusting one or more trim bits of a reference voltage generation and trim unit.

18. An apparatus as defined in claim 12, further comprising a tester instrument coupled to the FET to verify the reference voltage by sending a first verification current through the FET; determining whether the current detect signal indicates that the FET controller would turn off the FET in response to the first verification current during normal operation of the device; sending a second verification current through the FET; and determining whether the current detect signal indicates that the FET controller would turned off the FET in response to the second verification current during normal operation of the device.

19. An apparatus as defined in claim 18, wherein the first verification current is greater than the target threshold current, and wherein the second verification current is less than the target threshold current.

20. A method of testing a field-effect transistor (FET), comprising:
- setting a first controlled switch to prevent a current detect signal from reaching a FET controller, the FET controller to turn off the FET when the current detect signal indicates an overcurrent condition;
- setting a second controlled switch to route a first voltage associated with the FET to a voltage adjuster;
- sending a calibration current corresponding to a target threshold current through the FET;
- measuring the first voltage while the calibration current flows through the FET;
- measuring a second voltage associated with the FET while the calibration current flows through the FET;
- removing the calibration current from the FET after the first and second voltages are measured;
- calculating an on-resistance of the FET using the second voltage; and
- setting a reference voltage substantially equal to the first voltage, the reference voltage to be used to generate the current detect signal.

* * * * *